(12) United States Patent
Foster et al.

(10) Patent No.: US 7,493,869 B1
(45) Date of Patent: Feb. 24, 2009

(54) VERY LARGE AREA/VOLUME MICROWAVE ECR PLASMA AND ION SOURCE

(75) Inventors: John E. Foster, Strongsville, OH (US); Michael J. Patterson, Brunswick, OH (US)

(73) Assignee: The United States of America as represented by the Administration of NASA, Washington, DC (US)

( * ) Notice: Subject to any disclaimer, the term of this patent is extended or adjusted under 35 U.S.C. 154(b) by 587 days.

(21) Appl. No.: 11/311,183

(22) Filed: Dec. 16, 2005

(51) Int. Cl.
*C23C 16/00* (2006.01)

(52) U.S. Cl. .................. 118/723 AN; 118/723 MA; 156/345.41; 156/345.42

(58) Field of Classification Search ........ 118/723 MW, 118/723 MA, 723 MR, 723 AN; 156/345.41, 156/345.42; 315/111.21
See application file for complete search history.

(56) References Cited

U.S. PATENT DOCUMENTS

| | | | |
|---|---|---|---|
| 5,203,960 A | 4/1993 | Dandl | 156/643 |
| 5,324,362 A | 6/1994 | Schneider et al. | 118/723 MP |
| 5,370,765 A | 12/1994 | Dandl | 156/643 |
| 5,707,452 A | 1/1998 | Dandl | 118/723 MW |
| 6,153,977 A | 11/2000 | Taira et al. | 315/111.41 |
| 6,322,662 B1 | 11/2001 | Ishii et al. | 456/345 |
| 6,376,028 B1 | 4/2002 | Laurent et al. | 427/571 |
| 6,830,652 B1 * | 12/2004 | Ohmi et al. | 156/345.41 |
| 7,404,991 B2 * | 7/2008 | Ohmi et al. | 427/569 |
| 2002/0121344 A1 | 9/2002 | Noguchi | 156/345.48 |
| 2003/0173030 A1 | 9/2003 | Ishii et al. | 156/345.48 |
| 2003/0183170 A1 | 10/2003 | Kato et al. | 118/723 MW |
| 2004/0045674 A1 | 3/2004 | Ishii et al. | 156/345.48 |

FOREIGN PATENT DOCUMENTS

| | | |
|---|---|---|
| JP | 06151092 A | 5/1994 |
| JP | 06158298 A | 6/1994 |
| WO | WO 91/12353 | 8/1991 |

* cited by examiner

*Primary Examiner*—David Hung Vu
(74) *Attorney, Agent, or Firm*—Howard M. Cohn (57) ABSTRACT

The present invention is an apparatus and method for producing very large area and large volume plasmas. The invention utilizes electron cylcotron resonances in conjunction with permanent magnets to produce dense, uniform plasmas for long life ion thruster applications or for plasma processing applications such as etching, deposition, ion milling and ion implantation. The large area source is at least five times larger than the 12-inch wafers being processed to date. Its rectangular shape makes it easier to accommodate to materials processing than sources that are circular in shape. The source itself represents the largest ECR ion source built to date. It is electrodeless and does not utilize electromagnets to generate the ECR magnetic circuit, nor does it make use of windows.

20 Claims, 4 Drawing Sheets

VERY LARGE AREA/VOLUME MICROWAVE ECR PLASMA AND ION SOURCE

STATEMENT REGARDING FEDERALLY SPONSORED RESEARCH OR DEVELOPMENT

The invention described herein was made by an employee of the United States Government and may be manufactured and used by or for the Government for Government purposes without the payment of any royalties thereon or therefore.

RELATED APPLICATIONS

U.S. application Ser. No. 10/894,225 entitled LARGE AREA PLASMA SOURCE filed Jul. 19, 2004 by J. Foster.

U.S. application Ser. No. 10/925,499 SLOTTED ANTENNA WAVEGUIDE PLASMA SOURCE filed Aug. 25, 2004 by J. Foster.

TECHNICAL FIELD OF THE INVENTION

The present invention relates to large area and large volume plasma sources and to microwave antennas used for producing plasmas for use in ion thrusters, ion etching of surfaces, the embedding of ions within surfaces, production of electrons, and the like.

BACKGROUND

Plasmas consist of gaseous complexes in which atoms or molecules are dissociated into free electrons, ions, free radicals, and neutral particles. Stars, for instance, consist predominantly of plasmas. On earth, plasmas occur naturally in lightning bolts, flames, and similar high-energy phenomena, or may be manufactured by heating a gas to high temperatures, or by applying a strong electric field to a gas. Plasmas are called the "fourth state of matter" because their physical properties make them physically distinct from solids, liquids, and gases.

Ions, as well as electrons, from various kinds of plasma generators can be used in such industrial processes as etching, ashing (as with photoresist material or surfaces being chemically machined), deposition of materials such as oxides or nitrides, oxidation, sputtering, polymerization, ion implantation within surfaces and also in high-specific-impulse thrusters for use on satellites and other space vehicles.

Drawbacks of existing direct current (DC) ion sources include erosion, short service life of plasma generators, and plasma non-uniformity. Erosion derives from the impacting of high-speed ions on the surfaces of the machines that produce plasmas. For example, DC ion sources eject erosion products into the discharge plasma as a consequence of the fact that the discharge cathode is constantly being bombarded by the ions of the plasma in which it is immersed. This is an undesirable attribute from the standpoint of materials processing, as contamination of the work product can result. DC ion sources (and DC electron sources) have limited lifetimes due to being constantly subjected to erosion, and the cathodes that drive such plasma sources typically, over time, lose their ability to emit electrons so that eventually the cathodes fail. Typically, DC ion sources (ion thrusters in particular) utilize a single on-axis discharge cathode, which gives rise to peaked, non-uniform plasma density profiles at the exit plane. Such non-uniform profiles cause non-uniform wear of the ion extraction grids—thereby leading to failure by structural degradation or by electron backstreaming.

Disk shaped multi-slotted antenna designs have been used in the past to circumvent the aforesaid issues. These sources require, however, an insulating window for operation, i.e., for impedance matching and shielding. The insulating window, typically boron nitride makes such devices impractical for ion sources or ion thruster applications because the insulating window acquires over time a coating due to wear of the extraction grids. Said coating will ultimately prevent microwaves form penetrating the source and thus plasma production will cease.

The production of large-area plasmas that are also large in volume and provide dense plasmas is much sought after in the area of electric propulsion and plasma processing. Achieving these plasma characteristics is generally difficult from the standpoint of issues such as recombination, collisional losses and diffusion, all of which reduce discharge efficiency and uniformity of the discharged reaction mass. Moreover, the design of plasma generators that are intended for use in electric propulsion and plasma processing applications tends toward the production of plasma discharges having minimal internal erosion of the source. From an electric propulsion thruster standpoint, this design goal provides extended operation lifetime. For plasma processing, it reduces the amount of contamination of the materials being processed.

It is also important that plasma discharges take place at reduced pressures. Hollow cathode based sources in a multipole configuration can be implemented to generate reasonably large discharge plasmas. However, such discharges tend to be of poor uniformity and to introduce erosion products due to cathode degradation (as it is exposed to the discharge plasma and bombarded by high-energy discharge ions). In this respect, conventional hollow cathode based discharge sources are not a solution to long life and low erosion plasma sources.

The prior art evidenced in patent literature shows various microwave, permanent magnet, ECR plasma sources, but they suffer from limitations that the present invention overcomes.

U.S. Patent Application 2004/0045674 A1 to Ishii, et al., "Radial Antenna and Plasma Device Using It," describes a general microwave discharge, not an electron cyclotron resonance discharge (ECR). In this system, the microwave discharge is fundamentally limited in maximum plasma density, efficiency, and pressure. It is not an efficient ion source at the kinds of low pressures that are desirable for directional etching and sputter deposition applications in microelectronics. The invention of Ishii, et al., also uses a dielectric window, which can be problematic for both ion thruster uses and many deposition microelectronics reactors where metal vapor is present in the plasma. Metal ions and atoms can condense on the window, forming a layer that eventually prevents any microwave power from entering the system. Additionally, the device of Ishii, et al., utilizes a coaxial line connection to the slotted antenna, which limits the amount of power, plasma density and thus the maximum dimension to which the source can be built, thus limiting the ability to scale it up without recourse to a complete system redesign to scale up to a larger size.

U.S. Patent Application 2003/0183170 A1, to Kato, et al., "Plasma Processing Apparatus," also describes a microwave system that lacks the potential of ECR. The comments above, in relation to US 2004/0045674 A1 apply to this source as well.

U.S. Patent Application 2003/0173030, to Ishii, et al., "Plasma Processing Apparatus," describes essentially the same device addressed in relation to US 2004/0045674 A1. In this case however, Ishii, et al., focus on plasma processing application of the device. In this regard, its size is limited and can be scaled up only with difficulty.

U.S. Patent Application 2002/0121344 A1, to Noguchi, "Plasma Generating Device and Plasma Processing Apparatus Comprising Such a Device," utilizes the same physics described in the patents described above. Power is fed to it by means of a coaxial line.

Japanese Patent 06151092 A, to Kyoichi, "Microwave Plasma Treatment Device," also describes a microwave discharge device that is similar to the ones taught in the foregoing patents. It does not describe a high density low pressure ECR source.

Japanese Patent 06158298 A, to Mutsumi, et al., "Plasma Treating Device," does not describe microwave plasma of any sort. It describes a RF glow discharge for plasma processing applications. Such devices operated at pressures ~1 Torr and plasma densities are low and not particularly suited for etching or Sputter deposition. Sputter contamination is an issue for such a source.

WO 91/12353, "Device for Treating Substrates in a Gas-Based Plasma Produced by Microwaves," describes a specialized microwave plasma source intended for the processing of optical coatings. It suffers from limitations described above in comments 1-4.

U.S. Pat. No. 5,324,362, to Schneider, et al., "Apparatus for Treating Substrates in a Microwave-Generated Gas-Supported Plasma," apparently refers to a US patent WO 91/12353. This technology suffers from limitations described above in comments 1-4. As a sputtering source it could introduce contaminants in a deposition or etching plasma. It also presents a lifetime issue as the antenna would be subject to sputtering. The source also utilizes a microwave window, which has disadvantages described herein.

U.S. Pat. No. 6,376,028, to Laurent, et al. "Device and Method for Treating the Inside Surface of a Plastic Container with a Narrow Opening in a Plasma Enhanced Process," does not describe a plasma source but rather a device and process that requires a plasma (preferably microwave generated). It is not applicable to the present invention.

U.S. Pat. No. 6,153,977, to Taira, et al., "ECR Type Plasma Generating Apparatus," refers to an ECR source that utilizes a helical antenna that presumably launches a directed microwave beam toward and ECR zone established by two permanent magnets in opposition. It is inherently a small diameter device, and the ECR zone must be established between two closely spaced magnets. The device is not scalable to larger dimensions of the sort useful for large area plasma processing, high current, or long life ion thruster applications. Moreover, it is limited with respect to plasma density, which means that a workpiece to be processed must rely on the diffusion of the magnetized plasma, which is in general a slow process and can result in non-uniformities. And because it has an internal antenna it will be subject to sputter erosion limitations on service life, while also generating contaminants. The outer ceramic shield would be subject to the formation of metal coatings over time, which could affect the microwave coupling and thus the overall operation. Also because the device is coaxially fed, it is inherently limited to reduced microwave power.

U.S. Pat. No. 5,707,452, to Dandl, "Coaxial Microwave Applicator for an Electron Cyclotron Resonance Plasma Source," describes a permanent magnet ECR source that utilizes internal coaxially fed antennas immersed in ECR zones to produce plasma. This use of the coax fed antennas circumvents issues of a similar device patented by Dandl: U.S. Pat. No. 5,203,960 and U.S. Pat. No. 5,370,765 which utilize internal antennas that are subject to erosion and therefore become likely plasma contamination sources. Additionally, as each internal antenna is coaxially fed, which makes them power limited.

U.S. Pat. No. 5,203,960, to Dandl, "Method of Operation of Electron Cyclotron Resonance Plasma Source," and U.S. Pat. No. 5,370,765, also to Dandl, "Electron Cyclotron Resonance Plasma Source and Method of Operation," cannot be utilized efficiently at lower, more commercially assessable frequencies such as 2.45 GHZ. Patent '960 has cylindrical geometry which means that scaling to larger volumes requires a complete redesign of the magnetic circuit.

U.S. Pat. No. 6,322,662, to Ishii, et al. "Plasma Treatment System," utilizes a coax fed slotted antenna which inherently limits power and complicates implementation, as the coax feed would necessarily be water cooled at modest powers. It also uses a ceramic microwave window which would be subject to coating and so preclude its application to etching and deposition plasmas where metal vapors could be deposited on the ceramic. Additionally, the slotted antenna geometry of this invention is complicated and its overall layout does not lend well to scaling up in power. The antenna geometry is sophisticated, thereby imposing or requiring significant fabrication effort. Additionally, this invention is not an ECR source, but rather utilizes microwave energy to directly sustain the discharge via pair production. In this regard, it has to operate at a high background pressures that limit its uses. In general, the devices described in the Dandl patents, by virtue of the plasma production approach, will likely not scale with increasing diameter. The ECR zones are not couple via the ring cusp magnetic circuit, which allows for very large area/volume plasma production with straightforward scaling.

SUMMARY OF THE INVENTION

The present invention is a large electrodeless and windowless plasma source comprising a plasma chamber defining an enclosed and elongated prismatic volume and comprising a rectangular top wall having an inner planar surface, a rectangular bottom wall having an inner planar surface, two parallel quadrangular end walls having inner planar surfaces having centroids that define a length axis, a planar rectangular back portion having a height dimension and a planar rectangular exit plane having a height dimension and a perimeter. A slotted waveguide microwave antenna having a main axis and a plurality of matched slot pairs on one face feeds microwave energy into the plasma chamber, which contains a magnetic circuit comprising a first magnetic circuit portion and a second magnetic circuit portion. A means for injecting gases into the plasma chamber is provided. The prismatic plasma chamber can be a rectangular volume defined by the planar inner surfaces of the rectangular top wall and the rectangular bottom wall which are parallel to one another, the two parallel quadrangular end walls having inner planar surfaces, and the a planar rectangular back portion and the planar rectangular exit plane which are parallel to one another. The main axis of the slotted waveguide microwave antenna and the length axis of the plasma chamber that is defined by centroids of the two parallel quadrangular end walls are parallel and spaced apart. The first magnetic circuit portion is comprised of at least two linear magnets mounted external to the slotted waveguide microwave antenna and parallel to the main axis of the slotted waveguide and oriented into the plasma chamber, and the at least two linear magnets are permanent magnets having magnetic poles that are oriented in the same direction. The second magnetic circuit portion is comprised of a plurality of spaced apart linear magnets having magnetic poles and disposed about the inner top and bottom walls and the end walls of the prismatic volume of the plasma chamber so that each spaced apart linear magnet forms a planar rectangular magnet loop that is parallel to the planar rectangular exit plane, and the magnetic poles of adjacent spaced apart planar rectangular magnetic loops are oppositely oriented with respect to each other. The overall magnetic circuit is comprised of a plurality of spaced apart linear magnets and magnet loops having polarities that alternate. The slotted waveguide microwave antenna is mounted to the back portion of the plasma chamber and the plurality of matched slot pairs on one face of the antenna are oriented into the prismatic volume of the plasma chamber. Gas injection means is disposed about the perimeter of the exit plane. Ion optics means can be disposed across the exit plane so as to focus the exiting plasma beam of ions. The enclosed prismatic volume can, as an alternative to the rectangular volume described above, be trapezoidal in cross-sectional shape when viewed along the length axis defined by the centroids of the two parallel quadrangular end walls, said trapezoidal cross-sectional shape being further defined by the height dimension of the planar rectangular back portion being less than the height dimension of the planar rectangular exit plane, while the two parallel quadrangular end walls are trapezoidal in shape. Ion optics can be used as well with the trapezoidal shaped plasma chamber.

The present invention is a method of creating a large electrodeless and windowless plasma source, the method being characterized by the steps of assembling a plasma chamber enclosed within an elongated prismatic volume whose shape is defined by a rectangular top wall having an inner planar surface, a rectangular inner bottom wall having an inner planar surface, two parallel quadrangular end walls having inner planar surfaces and centroids that define a length axis of the plasma chamber, a planar rectangular back portion, and a planar rectangular exit plane, and the further steps of affixing to the planar rectangular back portion a slotted waveguide microwave antenna having a main axis, at least two linear permanent magnets oriented parallel to said main axis and having magnetic poles, and a plurality of matched slot pairs oriented into the prismatic volume of the plasma chamber, disposing within the prismatic volume of the plasma chamber a plurality of mutually adjacent, non-coplanar permanent magnet loops having magnetic poles, one loop of which is closest to the slotted waveguide microwave antenna and providing one or more inlets for a gas to be ionized. The method is further characterized by alignment of the main axis of the slotted waveguide microwave antenna parallel to the length axis defined by the centroids of the quadrangular end walls and includes the further step of orienting the magnetic poles of each mutually adjacent non-colinear permanent magnet loop in a direction opposite those of adjacent loops whose magnetic poles must be oriented such that each of the at least two linear permanent magnets affixed to the slotted waveguide microwave antenna are oriented in a single direction that is opposite that of the magnetic pole of the permanent magnet loop that is closest to the at least two linear permanent magnets. The method can also include the further step of installing ion optics means across the planar rectangular exit plane.

BRIEF DESCRIPTION OF THE FIGURES

The structure, operation, and advantages of the present invention will become apparent upon consideration of the description herein below taken in conjunction with the accompanying FIGURES. The FIGURES are intended to be illustrative, not limiting. Certain elements in some of the FIGURES may be omitted, or illustrated not-to-scale, for illustrative clarity. The cross-sectional views may be in the form of "slices," or "near-sighted" cross-sectional views, omitting certain background lines which would otherwise be visible in a "true" cross-sectional view, for illustrative clarity.

Although the invention is generally described in the context of these preferred embodiments, it should be understood that the FIGURES are not intended to limit the spirit and scope of the invention to these particular embodiments.

Certain elements in selected ones of the FIGURES may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity.

Elements of the FIGURES can be numbered such that similar (including identical) elements may be referred to with similar numbers in a single FIGURE. For example, each of a plurality of elements collectively referred to as 199 may be referred to individually as 199a, 199b, 199c, etc. Or, related but modified elements may have the same number but are distinguished by primes. For example, 109, 109', and 109" are three different elements which are similar or related in some way, but have significant modifications, e.g., a tire 109 having a static imbalance versus a different tire 109' of the same design, but having a couple imbalance. Such relationships, if any, between similar elements in the same or different figures will become apparent throughout the specification, including, if applicable, in the claims and abstract.

The structure, operation, and advantages of the present preferred embodiment of the invention will become further apparent upon consideration of the following description taken in conjunction with the accompanying FIGURES, wherein.

DETAILED DESCRIPTION OF THE PREFERRED EMBODIMENTS

The present invention is a large area and large volume microwave electron cyclotron resonance (ECR) plasma and ion source that can be used as either a high density, large area plasma source and/or as an ion source. It is electrodeless and windowless. Its applications include materials processing operations such as ion milling and ion implantation and ion propulsion for space vehicles. An analysis of the performance of the present invention, entitled, "High Power ECR Ion Thruster Discharge Characterization," was presented by the inventor at the International Electric Propulsion Conference on Nov. 2, 2005, and is incorporated herein in its entirety by reference hereto.

Figure 1A:
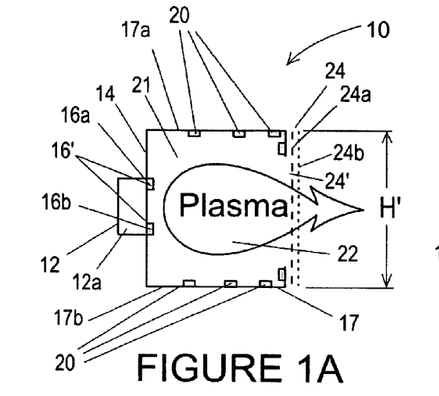
FIG. 1A is an orthogonal schematic cut-away end view of one embodiment of the invention.
Figure 1B:
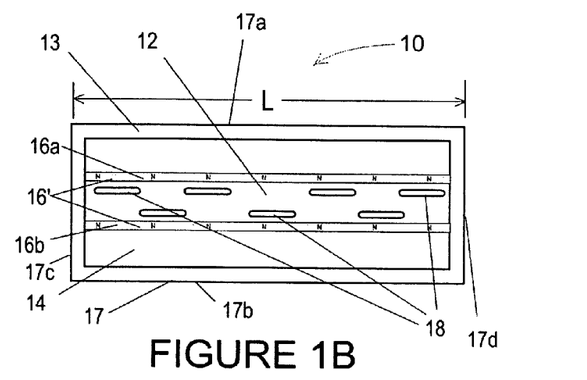
FIG. 1B is an orthogonal schematic front view of the embodiment of FIG. 1A.
Figures 1C, 1D, 1E:
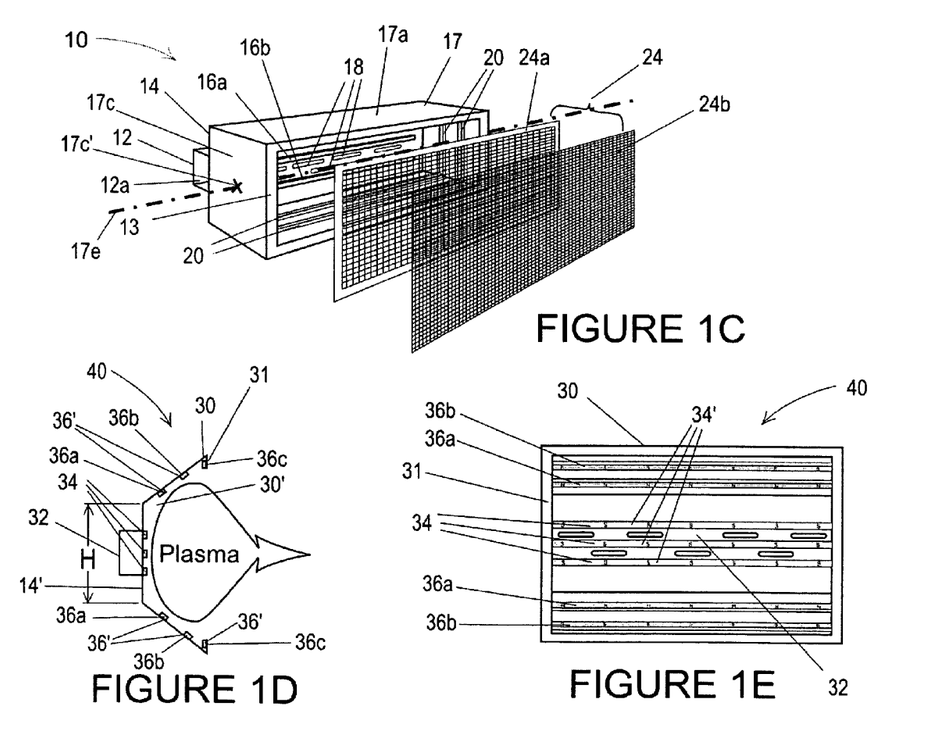
FIG. 1C is an oblique schematic view of the embodiment of FIG. 1A.
FIG. 1D is an orthogonal schematic cut-away end view of a second embodiment of the invention.
FIG. 1E is an orthogonal schematic front view of the embodiment of FIG. 1D.

FIG. 1A is an orthogonal, cut-away, schematic end-view of one embodiment 10 of a large area, large volume, plasma and ion source 10 according to the present invention. FIG. 1B is an orthogonal schematic front view of this embodiment of the ion source 10, and FIG. 1C is an oblique view of the ion source 10.

Figure 3:
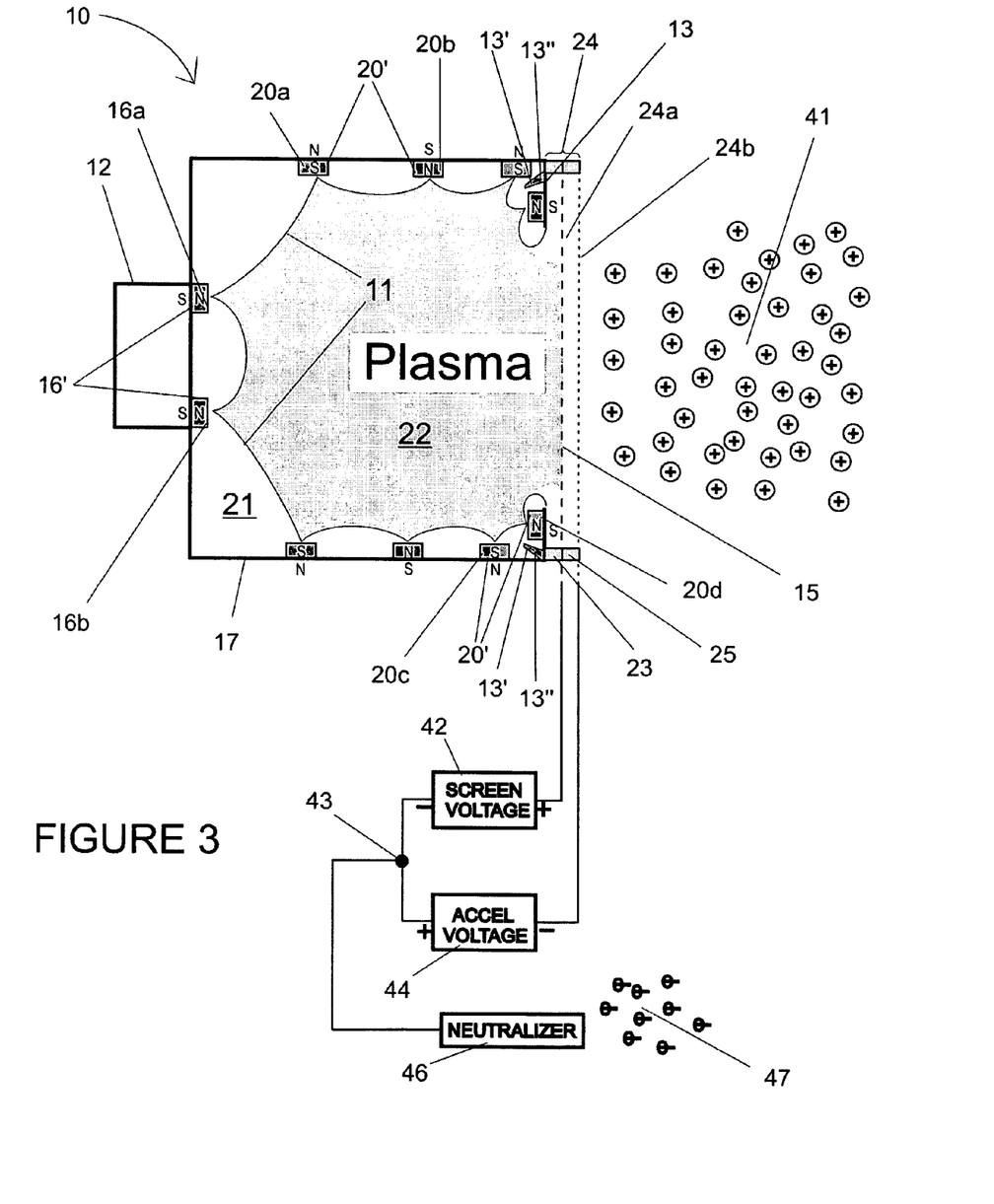
FIG. 3 is an end-on schematic view of one embodiment of the invention, showing the magnetic circuit and the operation of the ion optics.

The large area, large volume, plasma and ion source 10 comprises a slotted waveguide antenna 12 that is attached to the back wall 14 of the plasma and ion source 10. The slotted waveguide microwave antenna 12 is rectangular in cross section and extends along the long dimension L (FIG. 1B) on the back wall 14 of the plasma and ion source 10. The waveguide 12 is shown with two spaced apart permanent magnets 16a, 16b that are oriented along the length L of the waveguide, as shown in the orthogonal front view FIG. 1B wherein are shown the microwave radiating slots 18 whereat plasma formation takes place due to the interaction of gas atoms with microwaves. The spaced apart permanent magnets 16a,16b are the elements of a first magnetic circuit portion 16' of a total magnetic circuit 11 (FIG. 3). As described below, this first magnetic circuit 16' might include a third magnet between the two shown, 16a,16b, according to the frequency of the microwaves being used. Also as described below, plasma formation also takes place in the vicinity of a secondary magnet circuit portion 20' (FIG. 3) that is comprised of magnet rings 20 (FIG. 1A) due to electron cyclotron resonance discharge (ECR). (FIG. 3 shows the complete magnetic circuit 11, with its primary portion 16' and secondary portion 20' comprising at least the magnetic rings 20a,20b,20c,20d.) The waveguide magnets 16a,16b, comprising a first magnetic circuit portion 16', together with the secondary magnet circuit 20' (FIG. 3), form a magnetic circuit portion 11 (FIG. 3) that is described in more detail below. The magnetic circuit 11 of the invention is comprised of the first magnetic circuit portion 16', consisting of at least two linear magnets 16a,16b and the second magnetic circuit portion 20' (FIG. 3) that is contained within the plasma chamber, as described below.

The plasma chamber 21 has a prismatic volume defined by, or enclosed by, an elongated prismatic housing 17, the boundaries of which are a rectangular top wall 17a that has an inner planar surface and a rectangular bottom wall 17b that also has an inner planar surface, plus two parallel quadrangular end walls 17c,17d (FIG. 1B) having planar surfaces with centroids 17c',17d' that define a length axis 17e for the plasma chamber 21, and a planar rectangular back portion 14 having a height dimension H (shown in reference to back portion 14' in FIG. 1D) and a planar rectangular exit plane 24' having a height dimension H' and a perimeter 13. Injection of gas to be ionized is done by gas injection means 13' (FIG. 3) consisting of injection ports 13" (FIG. 3) disposed around the perimeter 13 of the plasma chamber 21 in the vicinity of the exit plane 24'. More specifically, and referring to FIG. 3, gas is injected roughly in the region between secondary magnet loops 20c and 20d. The present plasma source invention 10 can operate on virtually any common gas, including air, xenon, and CO2, all of which have been demonstrated.

Referring to FIGS. 1A, 1B, the waveguide magnets 16a, 16b are oriented such that their north poles (N) are oriented outward from the back 14 of the housing 17. South poles (S) could as well be so oriented. In either case, north or south, the pole orientations of the waveguide magnets 16a,16b are the same so as to create magnetic field lines that are, at least in the proximity of the radiating slots 18, more or less normal to the plane of the radiating slots. The poles of the secondary magnet rings 20 (20a,20b,20c,20d in FIG. 3) alternate in ways described below.

FIG. 1C is an oblique schematic view of the ion source invention 10, showing the slotted antenna rectangular waveguide 12 attached to the back 14 of housing 17. The waveguide magnets 16a,16b are shown, as are the radiating slots 18. Also shown in FIG. 1C is the ion optics means 24 which comprises two component electrical screen or grids 24a,24b, which are shown displaced forward of the main body 17 of the source 10. When the ion source invention 10 is used as a high-specific-impulse thruster, the grids 24a,24b of the ion optics 24 would be attached to and sealed against the front perimeter flange 13. The ion optics 24 would also be used when the ion/plasma source 10 is used in certain, but not all, materials processing operations such as ion milling and ion implantation.

FIGS. 1D and 1E show two orthogonal schematic views of a second embodiment 40 of the present plasma source invention wherein the housing 30 opens outward from the slotted waveguide 32 and encloses a plasma chamber 30' that is a prismatic volume. The waveguide 32 is shown in FIGS. 1D and 1E with three spaced-apart waveguide magnets 34. This different number of magnets is related to the microwave frequency, which is 5.85 GHz, versus 2.45 GHz used with the two-magnet set up shown in FIGS. 1A,1B and 1C. Either frequency, 5.85 GHz or 2.45 GHz, can be used in either of the embodiments 10 and 40 shown in FIGS. 1A through 1E, though with adjustments in the number of waveguide magnets 16a,16b and 34 according to the microwave frequency being used. In FIG. 1E, the three waveguide magnets 34 are shown as having their south poles facing outward.

Three spaced apart planar rectangular magnetic loops or rings 36a,36b,36c are shown disposed around the inner portion of the housing 30. The magnet planar loops 36a,36b,36c, of which only the upper and lower longitudinal portions are shown in FIG. 1E, have end segments (out of view in the FIGURE) which complete rectangular shaped circuits about the interior of the volume defined by the housing 30. The magnet planar loops 36a,36b,36c, and the corresponding magnet loops 20 in the rectangular plasma chamber embodiment portrayed in FIGS. 1A,1B and 1C, are the components of the secondary magnetic circuit portion 36' of this embodiment 40. Note in FIG. 1E that the orientation of the magnetic poles of the magnet ring 36a, which is closest to the slotted waveguide microwave antenna, is opposite that of the waveguide magnets 34 that comprise the primary magnetic circuit portion 34' of this embodiment 40.

Likewise, magnet ring 36b, which also extends around the rectangular interior of the housing 30, has its poles oriented opposite to that of the preceding ring 36a. Additionally, the third magnet ring 36c is disposed behind the forward flange 31 and has its north poles oriented so as to face into the volume defined by the housing 30. The magnetic circuit loops are made of lots of little magnets that are mounted in a linear way around the prismatic plasma chamber volume 21. No ion optics are shown with the embodiment 40 of FIGS. 1D and 1E.

Figures 2A, 2B:
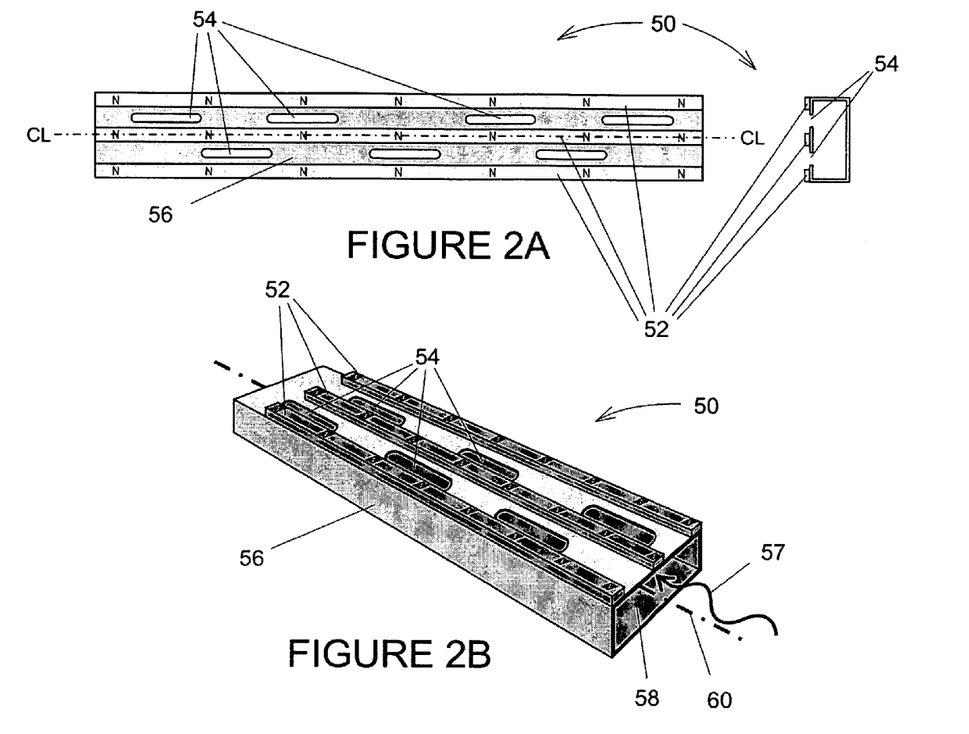
FIG. 2A is an orthogonal front view of a three-magnet slotted waveguide antenna and plasma source.
FIG. 2B is an oblique view of the waveguide antenna of FIG. 2A.
Figure 2C:
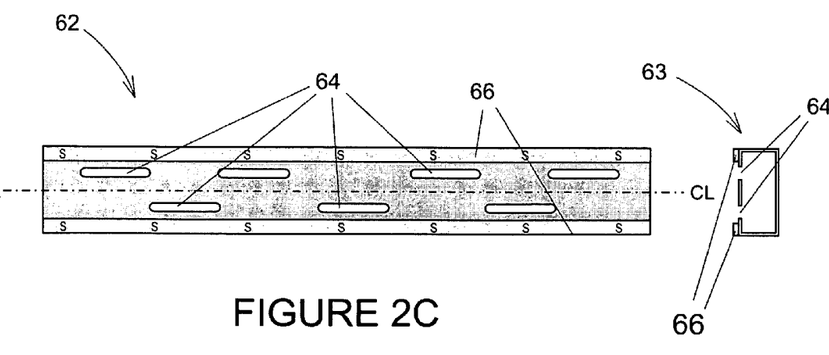
FIG. 2C is an orthogonal front view of a two-magnet slotted waveguide antenna and plasma source.

FIGS. 2A,2B and 2C show views of two embodiments of the slotted waveguide portion of the present ion and plasma source invention. FIG. 2A shows a slotted waveguide 50 in orthogonal longitudinal front view and in cross sectional end view. Three spaced apart permanent magnets 52 are separated by slots 54 in the body 56 of the waveguide 50. The slots 54 are matched pairs, as discussed in detail in an earlier patent application Ser. No. 10/925,499 entitled, "Slotted Antenna Waveguide Plasma Source", to the present inventor which is incorporated in its entirety herein. A matched pair consists of alternating slots displaced by one half of a wavelength, or equivalent multiple, from slot center to center. The slots 56 alternate about the centerline CL (denoted in FIG. 2A) of the mid-plane of the waveguide 50 and, when mounted upon the back surface 14 of the invention the matched slot pairs are oriented into the prismatic volume of the plasma chamber 21. The main difference between the slotted antenna geometry of the present invention and the one described in the "Slotted Antenna Waveguide Plasma Source" disclosure is the absence of a center line magnet when the present plasma source invention operates with the higher frequency microwaves (5.85 GHz), as shown in FIG. 2C. That is to say, at the 2.45 GHz operating frequency, the center line magnet 54' (located between slots 56) was used, but at 5.85 GHz, the center magnet was eliminated to improve performance. At the higher frequency, center-row magnets interfere with microwave launching, giving rise to significant reflection. The north poles (N) of the magnets 52 are shown oriented normal to the waveguide body 56. FIG. 2B is an oblique view of the slotted waveguide 50. Microwaves 57 enter one end 58 of the waveguide 50, along the waveguide main axis 60. A complete description of the slotted waveguide antenna portion of the present invention is given in the aforementioned disclosure, "Slotted Antenna Waveguide Plasma Source." Note, with respect to FIGS. 1A,1B,1C and 2B that the waveguide main axis 60 is parallel to and spaced apart from the length axis 17e.

FIG. 2C shows a slotted waveguide 62 in orthogonal longitudinal front view and also in cross sectional end view 63, with slots 64 and two spaced apart permanent magnets 66. That use of two instead of three magnets 66 reflects the intended microwave frequency of 5.85 GHz. South poles (S) of the permanent magnets 66 are shown facing outward, though the opposite orientation, with the north poles (N) facing outward is equally possible.

In general, waveguide sizes are standardized such that the waveguide's characteristics are matched with the wavelength of the microwave radiation to be used. For each waveguide size, there is a specific frequency range over which the waveguide will operate best. Also, in relation to the slotted waveguide portions of the present plasma source invention, the magnetic circuit near the waveguide slots, which is also called herein the first magnetic circuit portion, allows for gas breakdown and well-matched plasma production on the outside of waveguide in the vicinity of the slots 64. The plasma that is produced as a consequence of the optimized magnetic circuit that eliminates the need for dielectric windows to aid in impedance matching. Additionally, the magnetic field profile at each slot prevents plasma from backflowing into the slots and causing breakdowns there, and the magnetic field at and inside the slots is not sufficient to produce ECR so no plasma production can take place inside of the waveguide. Finally, the use of multiple slots reduces the electric field at each slot and thereby minimizes slot arcing that could be caused by the presence of the plasma, which thereby eliminates the need for a dielectric window. Plasma ions that are created near the radiating slots 54 (FIGS. 2A,2B), or 64 (FIG. 2C), emerge into the larger contained volume 21 (i.e., the plasma chamber of FIG. 1A) to create a plasma volume 22 that, in the illustration of FIG. 1A, progresses to the right in the FIGURE, through the system of plasma optics 24 comprising the two grids 24a and 24b.

The planar secondary magnet loops 20 in FIGS. 1A and 36a,36b,36c in FIGS. 1D,1E serve to direct the plasma in the directions indicated. The spacing of the planar magnet loops with respect to one another and in relation to the linear magnetic 16a,16b disposed upon the waveguide 12. The planar secondary magnetic loops are aligned such that the magnet sides run parallel with the long dimension of the slots so as to ensure a strong magnetic field in the region of the slots. Permanent magnets used in this work had surface field strengths between 2.8 kG and 3 kG, which is sufficiently strong to achieve ECR all the way up to microwave frequencies of 6 GHz. At higher frequencies, stronger magnets would have to used.

FIG. 3 shows in cross-sectional end view the plasma source 10 (of FIGS. 1A,1B and 1C) and its magnetic circuit 11 which arises due to the orientation of the poles (N and S) of the magnet rings 20a,20b,20c and 20d, which are disposed around the rectangular interior perimeter of the rectangular housing 17 and together comprise the secondary magnetic circuit elements 20' of the magnetic circuit 11. The orientation of the poles of the magnet rings alternates, as illustrated with Ns and Ss. The magnetic circuit 11 is created by the field lines of the magnet rings. The process of electron cyclotron resonance takes place in the vicinities of the magnet rings 20a,20b,20c,20d as electrons that have been excited by the microwaves spiral into and out of the densest portions of the magnetic field lines close to the magnet rings. The fast moving electrons induce further ionization of atoms of the feed gas when electrons collide with them, the result being the formation of a plasma within the contained volume or plasma chamber 21.

Across the exit plane 15 of the plasma chamber 21 is disposed the screen grid 24a portion of the ion optics 24. The grid 24a is mounted upon a suitable first insulating ring 23 attached between the periphery of the screen grid 24a and the exit flange 13. Axially outward of the screen grid 24a, an accelerator grid 24b is mounted, for example on a suitable second insulating ring 25 attached between the periphery of the screen grid 24a and the periphery of the accelerator grid 24b. As is conventional in the art, the screen grid 24a is electrically connected to a positive terminal of a screen voltage power supply 42, for extracting electrons from plasma 22 in the plasma chamber 21. Furthermore, the accelerator grid 24bis electrically connected to a negative terminal of an accelerator voltage power supply 44, for accelerating positive ions from the plasma 22 (that has been partially depleted of electrons) outward in an positive ion stream 41. A negative terminal of the screen voltage power supply 42 is tied to a positive terminal of the accelerator voltage power supply 44 through a common junction point 43.

To prevent a positive space charge from forming as an ion cloud that could obstruct or impede the ion stream 41, a neutralizer 46 is employed to generate a stream of electrons 47 that will recombine with the ions in the ion stream 41, thereby neutralizing the cloud back to an uncharged inert gas. A terminal of the neutralizer 46 is connected to the common junction point 43, thereby establishing an effective ground reference for the system, and also in effect bleeding off the electrons extracted by the screen grid 24a. For long service life (e.g., 10 years continuous operation) with a minimum amount of erosion, the screen grid 24a and the accelerator grid 24b are composed of pyrolytic graphite. Furthermore, it should be noted that a uniform dense ECR plasma as provided by the inventive plasma source 10 minimizes grid erosion by reducing peaks in the ion current density profile at the ion extraction plane (exit plane 15). A uniform plasma density profile at the exit plane 15 also prevents such things as crossover or over-focusing induced erosion.

Referring again to the magnetic circuit 11 that is defined by magnetic field lines that run between the magnet rings 20a, 20b,20c,20d (that are disposed in a rectangle shaped annulus around the rectangular inner perimeter of the housing 17)

comprising the secondary magnetic circuit 20', and the magnets 16a,16b comprising the primary magnetic circuit 16', the orientation of the poles of the first secondary or intermediate magnet ring 20a is such that a one of its first (S) and second (N) magnetic poles is against the outer housing 17 and the one magnetic pole's opposed magnetic pole is facing into the plasma chamber 21. The annular exit flange 13, which is composed of a ferromagnetic material, and that is attached to and extends into the exit edge of the plasma chamber 21 at the exit plane 15, has attached inside it a rectangle shaped annular magnet ring 20d such that one of its first (N) and second (S) magnetic poles is against the exit flange 13 and the one magnetic pole's opposed magnetic pole is facing into the plasma chamber 21. Thereby, the magnetic circuit 11 derives from the magnet rings 20a,20b,20c and 20d and also the magnets 16a,16b, all of which are composed of permanent magnet material such that inward facing magnetic poles (N, S) alternate polarity with respect to adjacent magnet rings while proceeding along the wall rectangular portion of the housing 17. The waveguide magnets 16a,16b, comprising the primary magnetic circuit portions 16', are accordingly oriented, as shown in FIG. 3.

Referring once again to the FIGS. 1A through 1C, the slotted antenna rectangular waveguide 12 injects microwaves in to a rectangular discharge chamber 21 contained within the housing 17. Because the waveguide antenna 12 extends the length L of the back 14 of the discharge chamber 21, it allows for distributed plasma production. Unlike single hollow cathode DC devices, the distributed plasma 22 that is produced gives rise to distributed ionization thereby improving discharge uniformity. Coupled to the slotted antenna 12 is the aforementioned magnetic circuit structure consisting of the waveguide magnets 16a,16b and the secondary magnets 20 which are arranged so as to generate contours on which ECR plasma production takes place. The secondary magnets 20a, 20b,20c,20d, in conjunction with the magnets 16a,16b, create the magnetically connected magnetic circuit 11 that 1) confines the produced discharge plasma and 2) circulates the hot electrons produced in the ECR zones.

The embodiments 10 and 30 in FIGS. 1D and 1E respectively have been demonstrated using two different microwave frequencies: 2.45 Ghz and 5.85 GHz. While waveguides designed to handle 2.45 GHz are commercially readily available, 5.85 MHz can be used for those applications requiring very high plasma densities even though power supplies at 5.85 Ghz are more expensive than at 2.45 GHz.

Figure 4:
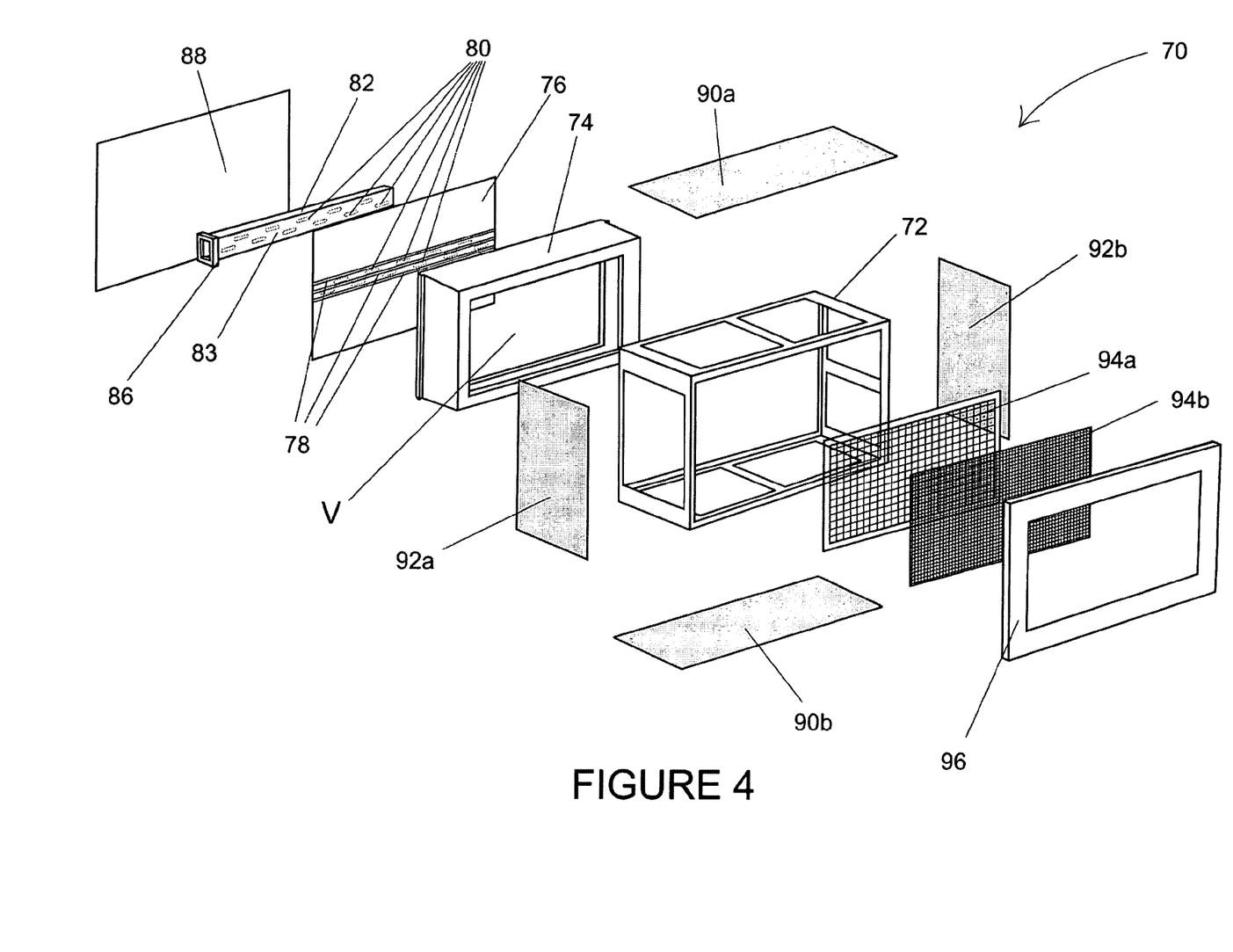
FIG. 4 is an oblique exploded view of an existing embodiment of the present invention.

FIG. 4 is an oblique exploded view the structural components of an actual embodiment of the plasma source 70 according to the present invention. When assembled, the plasma source 70 is contained with a main support frame 72 that holds the support structure 74 for the secondary magnets or magnet rings (not shown), along with the back plate 76 has attached to it the spaced-apart waveguide magnets 78 that straddle the radiating slots 80. The waveguide 82, as shown in the exploded view, has an open face 83. When the waveguide 82 is mounted against the back plate 76, the waveguide becomes complete with its waveguide magnets 78 and radiating slots 80 whereat the plasma forms and emerges into the volume V of the support structure 74 that holds the secondary magnets. Bracket 86 enables the waveguide 82 to be connected to a microwave source (not shown). When the plasma source 70 is assembled, it has a back cover 88 and top and bottom covers 90a,90b and side covers 92a,92b. The ion optics grids 94a,94b are held in place against the frame 72 and the housing 74 by the forward frame 96.

General Comments

Novel features of this invention include:

1. Completely electrodeless (erosion issues eliminated);

2. Plasma source does not require a microwave window;

3. Very large area, large volume plasmas are possible by simply extended the length of the slotted antenna and housing of secondary magnetic circuit;

4. Scalable to very high powers (minimal modifications to magnetic circuit required to make device larger) (also waveguide approach allows for operation up to 10 to 100 kW of input power); more specifically, the characteristic length dimension, parallel to the main axis of the slotted antenna waveguide, can be increased without limit;

5. Utilizes permanent magnets for ECR and plasma confinement;

6. Adaptable to operate over a range of frequencies (2.45, 5.85 GHz already demonstrated); in fact, compared to large circular plasma sources, the present rectangular unit has a broader frequency range.

7. Plasma in interior of device is not magnetized making it desirable for ion beam applications (ions are magnetized); the invention has been operated as a high energy ion source: beam power 13 kW;

8. Different types of gases can be used (reactive or nonreactive);

9. Metal vapors plasmas can also be processed in the discharge chamber since there is no microwave window at the source;

10. Source can operated at very low background pressures $10^{-5}$ to $10^{-4}$ Torr;

11. The rectangular shape lends itself to industrial applications;

12. Prototype source represents the largest, most powerful ECR source ever built;

13. The device operates at multiple frequencies, requiring only change in size waveguide of slotted antenna;

14. Device operates with permanent magnets. Large volume minimizes heat load to magnets so that device can operate over a wide power range without overheating magnets;

15. Device though large volume is self starting;

16. Device though large volume is also capable of operating over a wide range of flow rates;

17. Device operates on different gases including but not limited to air, xenon, and $CO_2$;

18. Emission spectra of device discharge plasma revealed only singly charge ions and no neutrals. The lack of multiple charged species in plasma suggests that erosion due to multiply charge species is minimal;

19. The large volume source is tunable over a wide power range with very low reflected powers (<10%). The discharge though high power and large volume is stable and does not mode hop;

20. The plasma is uniform in both the lateral and transverse dimensions;

21. Plasma potentials in the discharge are low, approximately 15 Volts or less, thus minimizing erosion issues; and 21. The source is scalable to larger sizes by simply extending the slotted antenna.

The large area plasma source described in this disclosure is electrodeless. It utilizes microwave electron cyclotron resonance (ECR) to generate the discharge. A slotted antenna has been implemented with a novel magnetic circuit geometry to produce a large area plasma. The source is also designed to be windowless. Both the implementation of the slotted antenna and the primary magnetic circuit allow for both large-area and large-volume plasmas to be produced. Such plasmas have been generated using this approach. For example, a source with an effective beam area of measuring 40×90 cm (and 40 cm deep) has already been tested and validated. It is scalable in power, size and plasma density. The present invention has demonstrated high plasma density operation at both 2.45 GHz and 5.85 GHz. Additionally, it has been demonstrated with the use of a permanent magnetic circuit instead of with the kinds of bulky and energy intensive electromagnets that are typically used in conventional ECR sources. The plasma source according to the present invention represents a means to generating large-area plasmas. Uniformity of the plasma can be tailored by adjusting slot and magnet locations.

The plasma source according to the present invention can be scaled upwards in its length dimension, i.e., in the direction parallel to the axis of the slotted waveguide antenna. It can be used to process multiple work pieces such as silicon wafers, with its rectangular shape being better-suited to industrial work areas than would be circular plasma sources of comparable characteristic linear dimension. The large size and high plasma density offered by the device gives it the capacity to process many items at once, which can dramatically improve productivity of companies that produce microchips from silicon wafers, i.e., many wafers can be processed at once. The same holds true for fabs that do depositions, implantations, or etchings. This plasma and ion source can be used with reactive gases used in etching industry. Large area ion implantation source for surface modifications can also benefit from this technology.

This ion source invention offers benefits over hollow cathode technology, with perhaps the most important to the commercial industry being that a very clean (few contaminants), high volume plasma can be generated.

In the realm of ion propulsion, this invention can also be adapted to producing dense, uniform plasmas for long life ion thruster applications.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

The invention claimed is:

1. A large electrodeless and windowless plasma source comprising:
   a plasma chamber defining an enclosed, elongated prismatic volume and comprising:
      a rectangular top wall having an inner planar surface;
      a rectangular bottom wall having an inner planar surface;
      two parallel quadrangular end walls having inner planar surfaces having centroids that define a length axis;
      a planar rectangular back portion having a height dimension; and
      a planar rectangular exit plane having a height dimension and a perimeter;
   a slotted waveguide microwave antenna having a main axis and a plurality of matched slot pairs on one face; and
   a magnetic circuit comprising:
      a first magnetic circuit portion; and
      a second magnetic circuit portion; and
   a gas injection means.

2. The large electrodeless and windowless plasma source of claim 1 wherein the enclosed prismatic volume is a rectangular volume defined by:
   the planar inner surfaces of the rectangular top wall and the rectangular bottom wall which are parallel to one another;
   the two parallel quadrangular end walls having inner planar surfaces; and
   the planar rectangular back portion and the planar rectangular exit plane which are parallel to one another.

3. The large electrodeless and windowless plasma source of claim 1 wherein the main axis of the slotted waveguide microwave antenna and the length axis of the plasma chamber that is defined by centroids of the two parallel quadrangular end walls are parallel and spaced apart.

4. The large electrodeless and windowless plasma source of claim 1 wherein the first magnetic circuit portion is comprised of at least two linear magnets mounted external to the slotted waveguide microwave antenna and parallel to the main axis of the slotted waveguide and oriented into the plasma chamber.

5. The large electrodeless and windowless plasma source of claim 4 wherein the at least two linear magnets are permanent magnets having magnetic poles.

6. The large electrodeless and windowless plasma source of claim 5 wherein:
   magnetic poles of the at least two linear magnets are oriented in the same direction.

7. The large electrodeless and windowless plasma source of claim 1 wherein:
   the second magnetic circuit portion is comprised of a plurality of spaced apart linear magnets having magnetic poles and disposed about the inner top and bottom walls and the end walls of the prismatic volume of the plasma chamber so that each spaced apart linear magnet forms a planar rectangular magnet loop that is parallel to the planar rectangular exit plane.

8. The large electrodeless and windowless plasma source of claim 7 wherein:
   the magnetic poles of adjacent spaced apart planar rectangular magnetic loops are oppositely oriented with respect to each other.

9. The large electrodeless and windowless plasma source of claim 1 wherein:
   the magnetic circuit is comprised of a plurality of spaced apart linear magnets and magnet loops having polarities that alternate.

10. The large electrodeless and windowless plasma source of claim 1 wherein:
the slotted waveguide microwave antenna is mounted to the back portion of the plasma chamber and the plurality of matched slot pairs on one face are oriented into the prismatic volume of the plasma chamber.

11. The large electrodeless and windowless plasma source of claim 1 wherein the gas injection means is disposed about the perimeter of the exit plane.

12. The large electrodeless and windowless plasma source of claim 1 wherein the exit plane of the plasma chamber has ion optics means disposed across it.

13. The large electrodeless and windowless plasma source of claim 1 wherein the enclosed prismatic volume has a trapezoidal cross-sectional shape when viewed along the length axis defined by the centroids of the two parallel quadrangular end walls, said trapezoidal cross-sectional shape being further defined by the height dimension of the planar rectangular back portion being less than the height dimension of the planar rectangular exit plane.

14. The large electrodeless and windowless plasma source of claim 1 wherein the two parallel quadrangular end walls are trapezoidal in shape.

15. The large electrodeless and windowless plasma source of claim 1 wherein the planar rectangular exit plane of the plasma chamber has ion optics means disposed across it.

16. The method of creating a large electrodeless and windowless plasma source, the method being characterized by the steps of:
assembling a plasma chamber enclosed within an elongated prismatic volume whose shape is defined by a rectangular top wall having an inner planar surface, a rectangular inner bottom wall having an inner planar surface, two parallel quadrangular end walls having inner planar surfaces and centroids that define a length axis of the plasma chamber, a planar rectangular back portion, and a planar rectangular exit plane;
affixing to the planar rectangular back portion a slotted waveguide microwave antenna having a main axis, at least two linear permanent magnets oriented parallel to said main axis and having magnetic poles, and a plurality of matched slot pairs oriented into the prismatic volume of the plasma chamber;
disposing within the prismatic volume of the plasma chamber a plurality of mutually adjacent, non-coplanar permanent magnet loops having magnetic poles, one loop of which is closest to the slotted waveguide microwave antenna; and
providing one or more inlets for a gas to be ionized.

17. The method of claim 16 wherein the method of affixing of a slotted waveguide microwave antenna to the rectangular back portion defining the prismatic volume of the plasma chamber includes the further step of aligning the main axis of the slotted waveguide microwave antenna parallel to the length axis defined by the centroids of the quadrangular end walls.

18. The method of claim 16 wherein the method of disposing within the prismatic volume of the plasma chamber a plurality of mutually adjacent non-coplanar permanent magnet loops, one of which is closest to the at least two linear permanent magnets of the slotted waveguide microwave antenna includes the further step of orienting the magnetic poles of each mutually adjacent non-colinear permanent magnet loop in a direction opposite those of adjacent loops.

19. The method of claim 18 wherein the method of orienting the magnetic poles of each mutually adjacent permanent magnet loop in a direction opposite those of adjacent loops includes the further step of orienting the magnetic poles of each of the at least two linear permanent magnets affixed to the slotted waveguide microwave antenna in a single direction that is opposite that of the magnetic pole of the permanent magnet loop that is closest to the at least two linear permanent magnets.

20. The method of claim 16 where in the method of creating a large electrodeless and windowless plasma source includes the further step of installing ion optics means across the planar rectangular exit plane.

\* \* \* \* \*